(12) United States Patent
Lee et al.

(10) Patent No.: US 9,508,732 B2
(45) Date of Patent: Nov. 29, 2016

(54) SEMICONDUCTOR DEVICES INCLUDING A GATE ELECTRODE AND METHODS OF MANUFACTURING THE SAME

(71) Applicant: SAMSUNG ELECTRONICS CO., LTD., Suwon-Si, Gyeonggi-Do (KR)

(72) Inventors: Sung-Hun Lee, Yongin-si (KR); Ki-Yong Kim, Suwon-si (KR); Sung-Wook Park, Seoul (KR); Gyu-Yeol Lee, Hwasung (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/746,205

(22) Filed: Jun. 22, 2015

(65) Prior Publication Data

US 2015/0325580 A1 Nov. 12, 2015

Related U.S. Application Data

(63) Continuation of application No. 13/299,464, filed on Nov. 18, 2011, now Pat. No. 9,076,682.

(30) Foreign Application Priority Data

Feb. 22, 2011 (KR) .................. 10-2011-0015472

(51) Int. Cl.
*H01L 27/115* (2006.01)
*H01L 29/49* (2006.01)
*H01L 29/788* (2006.01)
(Continued)

(52) U.S. Cl.
CPC ... *H01L 27/11524* (2013.01); *H01L 21/28273* (2013.01); *H01L 27/11529* (2013.01); *H01L 29/42328* (2013.01); *H01L 29/495* (2013.01); *H01L 29/4975* (2013.01); *H01L 29/788* (2013.01); *H01L 21/823437* (2013.01);
(Continued)

(58) Field of Classification Search
CPC .................. H01L 27/11524; H01L 27/11526; H01L 29/42324
USPC ....................... 257/319, 350, E27.06, E29.3; 365/185.18
See application file for complete search history.

(56) References Cited

U.S. PATENT DOCUMENTS

| 7,067,872 B2 | 6/2006 | Ichige et al. |
| 2010/0105198 A1 | 4/2010 | Lee et al. |

(Continued)

FOREIGN PATENT DOCUMENTS

| JP | 2003-060092 | 2/2003 |
| KR | 1020100046888 | 5/2010 |
| KR | 1020100050910 | 5/2010 |

*Primary Examiner* — Thomas L Dickey
(74) *Attorney, Agent, or Firm* — F. Chau & Associates, LLC

(57) ABSTRACT

In a semiconductor device, a first gate structure is provided in a cell transistor region and includes a floating gate electrode, a first dielectric layer pattern, and a control gate electrode including a first metal silicide pattern. A second gate structure is provided in a selecting transistor region and includes a first conductive layer pattern, a second dielectric layer pattern, and a first gate electrode including a second metal silicide pattern. A third gate structure is provided in a peripheral circuit region and includes a second conductive layer pattern, a third dielectric layer pattern including opening portions on the second conductive layer pattern, and a second gate electrode including a concavo-convex portion at an upper surface portion thereof and a third metal silicide pattern. The third metal silicide pattern has a uniform thickness.

18 Claims, 13 Drawing Sheets

(51) Int. Cl.
*H01L 29/423* (2006.01)
*H01L 21/28* (2006.01)
*H01L 21/8234* (2006.01)

(52) U.S. Cl.
CPC ............ *H01L21/823443* (2013.01); *H01L 21/823456* (2013.01)

(56) References Cited

U.S. PATENT DOCUMENTS

2010/0112772 A1   5/2010   Jung et al.
2011/0207313 A1   8/2011   Lim et al.
2011/0260235 A1*  10/2011  Orimoto ........... H01L 21/28273
                                              257/319

* cited by examiner

SEMICONDUCTOR DEVICES INCLUDING A GATE ELECTRODE AND METHODS OF MANUFACTURING THE SAME

CROSS-RELATED APPLICATION

This application is a Division of U.S. patent application Ser. No. 13/299,464, filed Nov. 18, 2011, which claims priority under 35 USC §119 to Korean Patent Application No. 10-2011-0015472, filed on Feb. 22, 2011, the disclosure of which is hereby incorporated by reference herein in its entirety.

BACKGROUND

1. Field

Example embodiments relate to semiconductor devices and methods of manufacturing the same. More particularly, example embodiments relate to semiconductor devices including a gate electrode and methods of manufacturing the same.

2. Discussion of the Related Art

To manufacture a highly integrated semiconductor device, a gate electrode having a low resistance may be required. A portion of the gate electrode may be formed as a metal silicide pattern. A semiconductor device may include gate electrodes having various line widths, and forming metal silicide patterns having a uniform thickness may be difficult. When the metal silicide patterns having non-uniform thicknesses are formed, resistances of the gate electrodes may be locally increased and a semiconductor device having the metal silicide patterns as part of the gate electrodes may malfunction.

SUMMARY

Example embodiments provide a semiconductor device including a gate electrode having a low resistance and stable operating characteristics, and a method of manufacturing the semiconductor device.

According to example embodiments, there is provided a semiconductor device. The semiconductor device includes a first gate structure provided in a cell transistor region of a substrate. The first gate structure includes a floating gate electrode, a first dielectric layer pattern covering a whole upper surface portion of the floating gate electrode, and a control gate electrode including a first metal silicide pattern subsequently integrated one by one. The semiconductor device includes a second gate structure provided in a selecting transistor region of the substrate. The second gate structure includes a first conductive layer pattern, a second dielectric layer pattern covering a portion of an upper surface portion of the first conductive layer pattern and a first gate electrode, wherein the first gate electrode includes a polysilicon layer pattern formed on the second dielectric layer pattern, and electrically connected to the first conductive layer pattern, and a second metal silicide pattern is formed on the polysilicon layer pattern. The semiconductor device also includes a third gate structure provided in a peripheral circuit region of the substrate. The third gate structure includes a second conductive layer pattern, a third dielectric layer pattern including a plurality of opening portions on the second conductive layer pattern and a second gate electrode including a concavo-convex portion at an upper surface thereof and a third metal silicide pattern subsequently integrated one by one.

In example embodiments, the first and second gate structures may have a narrower line width than that of the third gate structure.

In example embodiments, the opening portions included in the third dielectric layer pattern each may have one of a line shape or a hole shape.

In example embodiments, an upper surface portion of the second conductive layer pattern may include a concavo-convex portion.

In example embodiments, an upper surface portion of the third metal silicide pattern may include a concavo-convex portion.

According to example embodiments, there is provided a method of manufacturing a semiconductor device. In the method, a first conductive layer, a dielectric layer and a second conductive layer are formed on a substrate. The second conductive layer and the dielectric layer formed in a peripheral circuit region of the substrate are etched to from a plurality of first openings. The second conductive layer and the dielectric layer formed in a selecting transistor region of the substrate are etched to form a second opening. A third conductive layer including a concavo-convex portion is formed in the first and second openings and on the second conductive layer. The third conductive layer, the second conductive layer, the dielectric layer and the first conductive layer are patterned to form first gate patterns in a cell transistor region of the substrate, to form second gate patterns in the selecting transistor region of the substrate and to form third gate patterns in the peripheral circuit region of the substrate. A first, a second and a third metal silicide patterns are respectively formed on the first gate patterns, the second gate patterns and the third gate patterns.

In example embodiments, the first and second openings may be formed through a same etching process.

In example embodiments, an upper surface of the third gate pattern may include a concavo-convex portion.

In example embodiments, the third conductive layer may include polysilicon.

In example embodiments, the first openings each may have one of a line shape or a hole shape.

In example embodiments, the first gate pattern and the second gate pattern may have a line width narrower than that of the third gate pattern.

In example embodiments, the first conductive layer may be partially etched to a predetermined thickness when forming the first and the second openings.

In example embodiments, a width and a depth of the concavo-convex portion may be controlled by controlling a width and a depth of the first and the second openings and an interval between the openings.

In example embodiments, the second and the third conductive layers may be formed by depositing polysilicon.

In example embodiments, the first, second and third metal silicide patterns may include one of nickel silicide, tungsten silicide and cobalt silicide.

In accordance with an embodiment of the inventive concept, a gate structure comprises a substrate, an oxide layer on the substrate, a first conductive layer formed on the oxide layer, a dielectric layer formed on the first conductive layer, a second conductive layer formed on the dielectric layer, a plurality of openings spaced apart from each other at a predetermined interval, wherein the plurality of openings are formed through the second conductive layer and the dielectric layer, and through a top part of the first conductive layer, a third conductive layer formed on the second conductive layer and in the plurality of openings, wherein an upper surface of the third conductive layer includes a concavo-convex pattern, the concave portions of the pattern corresponding to the respective openings.

A metal silicide pattern is formed on the third conductive layer, and includes a concavo-convex pattern corresponding to the concavo-convex pattern of the third conductive layer. The metal silicide pattern may have a substantially uniform thickness along a line width of the gate structure.

The second and third conductive layers may comprise polysilicon.

The gate structure may be formed in a peripheral circuit region of the substrate.

As described above, the gate structure included in the semiconductor device in accordance with the present inventive concept may include a metal silicide pattern having a uniform thickness. Accordingly, the gate structure may have a low resistance. In addition, a resistance difference between the gate structures may be very small. The electrical property of the semiconductor device may be good and an operation defect may be decreased.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments.

FIG. 2 is a plan view illustrating a gate electrode of a transistor for a peripheral circuit included in the semiconductor device illustrated in FIG. 1.

FIGS. 3 to 10 are cross-sectional views illustrating a method of manufacturing the semiconductor device illustrated in FIG. 1.

FIG. 11 is a plan view illustrating a semiconductor device in accordance with another example embodiment.

FIG. 12 is a cross-sectional view illustrating a semiconductor device in accordance with another example embodiment.

FIGS. 13 to 16 are cross-sectional views illustrating a method of manufacturing the semiconductor device illustrated in FIG. 12.

FIG. 17 is a block diagram illustrating an information processing system including a semiconductor device manufactured in accordance with example embodiments.

DETAILED DESCRIPTION OF THE EMBODIMENTS

Figure 1:
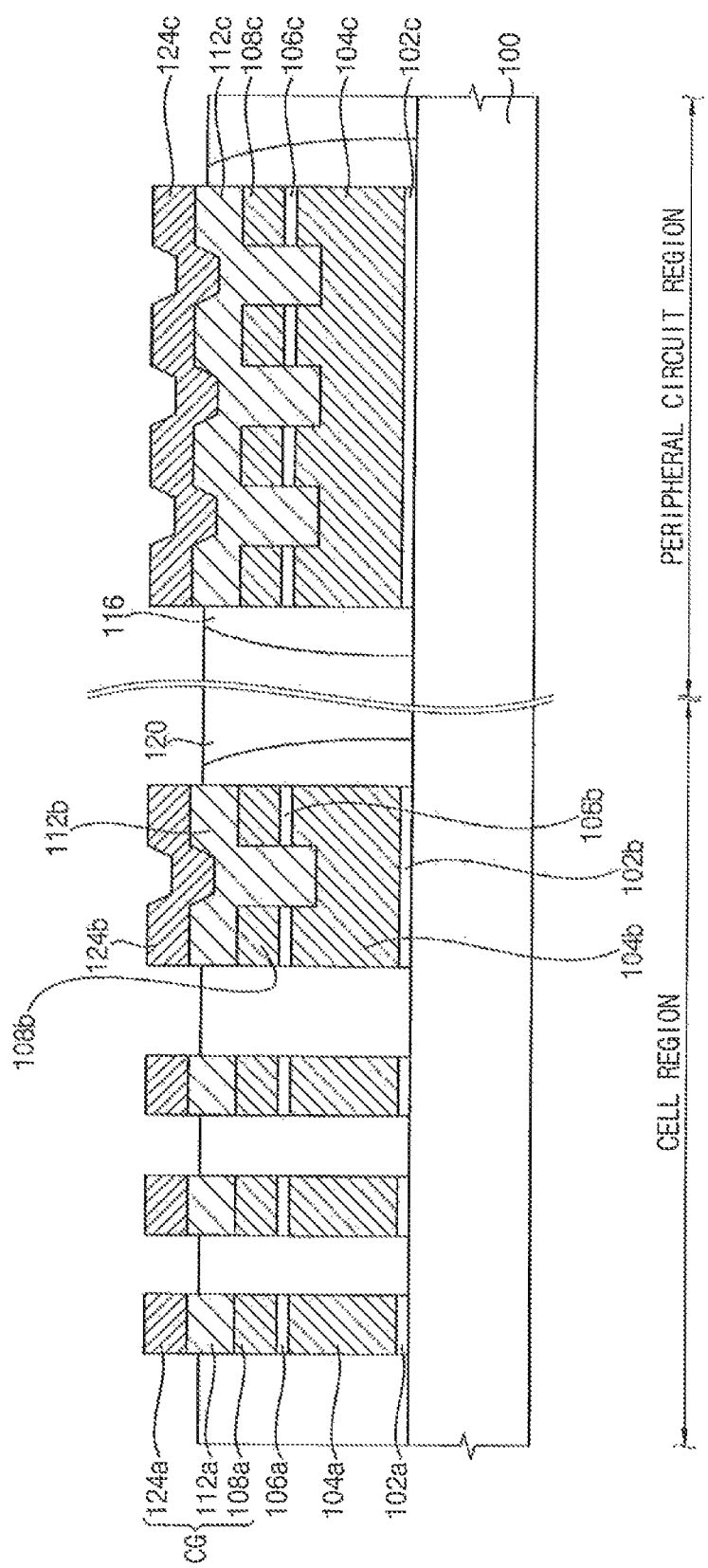
FIGS. 1 to 17 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

Hereinafter, example embodiments on semiconductor devices and methods of manufacturing the semiconductor devices will be explained in further detail.

Figure 2:
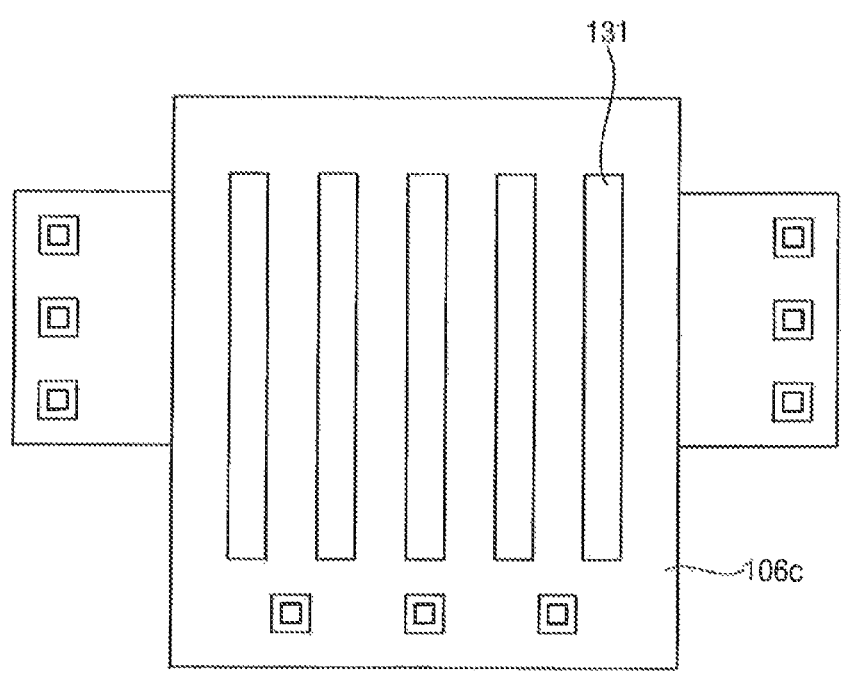

FIG. 1 is a cross-sectional view illustrating a semiconductor device in accordance with example embodiments. FIG. 2 is a plan view illustrating a dielectric layer portion in a gate electrode of a transistor in a peripheral circuit region included in the semiconductor device illustrated in FIG. 1.

In accordance with an embodiment of the inventive concept, the semiconductor device illustrated in FIG. 1 is a NAND flash memory device.

Referring to FIGS. 1 and 2, a substrate 100 including a cell region and a peripheral circuit region separated from each other is provided. In the cell region, a string structure including cell transistors for storing data and selecting transistors for selecting the cells is formed. In the peripheral circuit region, circuits for applying electric signals to each of the cell transistors are provided and transistors for peripheral circuits are formed.

The cell transistors formed in the cell region include a first gate structure including integrated layers of a tunnel oxide layer pattern 102a, a floating gate pattern 104a, a first dielectric layer pattern 106a and a control gate pattern. In accordance with an embodiment of the inventive concept, the first gate structure has a first line width, the control gate pattern functions as word lines, and the cell transistors are connected to each other in series. The control gate pattern CG includes a first polysilicon pattern 108a, a second polysilicon pattern 112a and a first metal silicide pattern 124a integrated sequentially. The first metal silicide pattern 124a is formed using a material such as, for example, cobalt silicide, nickel silicide, tungsten silicide, etc. In addition, in accordance with an embodiment of the inventive concept, the floating gate pattern 104a is formed using polysilicon material.

In accordance with an embodiment of the inventive concept, at both end portions of the cell transistors connected in series, a ground selecting transistor and a string selecting transistor are provided. A gate of the ground selecting transistor is provided as a ground selecting line (GSL) and a gate of the string selecting transistor is provided as a string selecting line (SSL). The selecting transistors include a second gate structure including integrated layers of a first gate oxide layer pattern 102b, a first conductive layer pattern 104b, a second dielectric layer pattern 106b covering a portion of an upper surface of the first conductive layer pattern 104b, a third polysilicon pattern 108b, a fourth polysilicon pattern 112b and a second metal silicide pattern 124b. In accordance with an embodiment of the inventive concept, the second gate structure has a second line width greater than the first line width of the first gate structure. A common source line (not illustrated) connected to the ground selecting transistor may be provided.

In accordance with an embodiment of the inventive concept, the first conductive layer pattern 104b includes the same material as the floating gate pattern 104a and the third and fourth polysilicon patterns 108b and 112b include the same polysilicon material as the control gate pattern. In addition, the second metal silicide pattern 124b includes the same material as the first metal silicide pattern 124a.

An opening portion included in the second dielectric layer pattern 106b is positioned at a middle of an interface between the first conductive layer pattern 104b and the third polysilicon pattern 108b. At the opening portion, the first conductive layer pattern 104b and the third polysilicon pattern 108b contact each other through the fourth polysilicon pattern 112b to accomplish an electrical connection between the first conductive layer pattern 104b and the third polysilicon pattern 108b.

The transistor for the peripheral circuit formed in the peripheral circuit region includes a third gate structure including integrated layers of a second gate oxide layer pattern 102c, a second conductive layer pattern 104c, a third dielectric layer pattern 106c, including a plurality of the opening portions 131, on the second conductive layer pattern 104c, a fifth polysilicon pattern 108c, a sixth polysilicon pattern 112c and a third metal silicide pattern 124c. Since the transistor for the peripheral circuit may have a higher operating voltage than the cell transistor, the third gate structure has a third line width greater than the second line width. Particularly, in accordance with an embodiment of the inventive concept, the third gate structure has a line width of about twice the second line width or greater.

The second conductive layer pattern 104c includes the same material as the floating gate pattern 104a. The fifth and sixth polysilicon patterns 108c and 112c include the same polysilicon material included in the control gate pattern. The third metal silicide pattern 124c includes the same material as the first metal silicide pattern 124a.

An upper surface of the second conductive layer pattern 104c includes a first concavo-convex portion. The second conductive layer pattern 104c includes a low step portion and a high step portion. The low step portion of the second conductive layer pattern 104c shows a plurality of line shapes provided in parallel to each other, when viewed from a top of the second conductive layer pattern 104c. In example embodiments, the upper surface of the second conductive layer pattern 104c has a planar surface, with the exception of the concavo-convex portion.

The opening portions 131 in the third dielectric layer pattern 106c are positioned at the low step portion of the second conductive layer pattern 104c. That is, the third dielectric layer pattern 106c is provided on the upper surface of the high step portion of the second conductive layer pattern 104c.

The second conductive layer pattern 104c and the fifth polysilicon pattern 108c contact to each other through the sixth polysilicon pattern 112c at the opening portion 131 to make an electric connection between the second conductive layer pattern 104c and the fifth polysilicon pattern 108c. Since the third dielectric layer pattern 106c is not formed at the opening portion 131, the height of the upper surface portion of the sixth polysilicon pattern 112c at the opening portion 131 is smaller than the height of the sixth polysilicon pattern 112c positioned on the third dielectric layer pattern 106c.

An upper surface portion of the sixth polysilicon pattern 112c is not planar, and includes a second concavo-convex portion. The sixth polysilicon pattern 112c includes a low step portion and a high step portion. In example embodiments, since the opening portion 131 is positioned at the low step portion, the upper surface portion of the sixth polysilicon pattern 112c includes repeating line shapes of the low step portion and the high step portion. In example embodiments, the width of the high step portion and the low step portion is smaller than the second line width.

An upper surface portion of the third metal silicide pattern 124c provided on the sixth polysilicon pattern 112c also includes a concavo-convex portion of repeating line shapes of low step and high step portions. In example embodiments, the third metal silicide pattern 124c may have a uniform thickness.

The semiconductor device in example embodiments includes gate electrodes having a low resistance and having small deviations in dimensions, such as thickness. Accordingly, the semiconductor device in example embodiments exhibits high performance.

FIGS. 3 to 10 are cross-sectional views illustrating a method of manufacturing the semiconductor device illustrated in FIG. 1.

Figure 3:
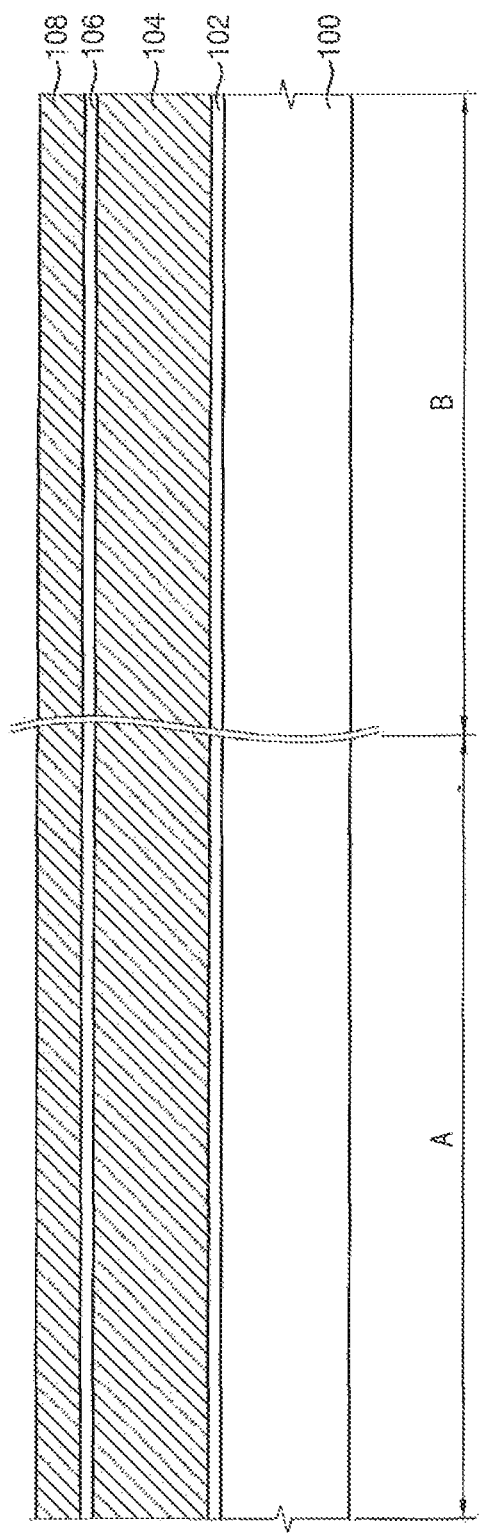

Referring to FIG. 3, a substrate 100 including a cell region A and a peripheral circuit region B separated from each other is provided. A device isolating process is performed to form a device isolating layer pattern (not illustrated) dividing the substrate 100 into an active region and a field region.

On the substrate 100 in the active region, a tunnel oxide layer 102 and a floating gate layer 104 are formed. The tunnel oxide layer 102 is formed using, for example, an oxide material including silicon oxide, an oxynitride material including silicon oxynitride, etc. In accordance with an embodiment of the inventive concept, the floating gate layer 104 is formed by depositing impurity doped polysilicon on the tunnel oxide layer 102.

On the floating gate layer 104, a blocking dielectric layer 106 is formed. In accordance with an embodiment of the inventive concept, the blocking dielectric layer 106 is formed as an ONO layer including an oxide layer/nitride layer/oxide layer using an oxide material and a nitride material. Alternatively, the blocking dielectric layer 106 is formed using metal oxide having a high dielectricity to increase capacitance and to reduce leakage current. The metal oxide having high dielectricity may include, for example, hafnium oxide, titanium oxide, tantalum oxide, zirconium oxide, aluminum oxide, etc. In accordance with an embodiment of the inventive concept, the metal oxide having high dielectricity is partially etched. In this case, the blocking dielectric layer 106 may be formed as the ONO layer including the oxide layer/nitride layer/oxide layer.

On the blocking dielectric layer 106, a first polysilicon layer 108 is formed. The first polysilicon layer 108 functions as a mask for partially etching the blocking dielectric layer 106. Part of the first polysilicon layer 108 forms part of the control gate electrode.

Figure 4:
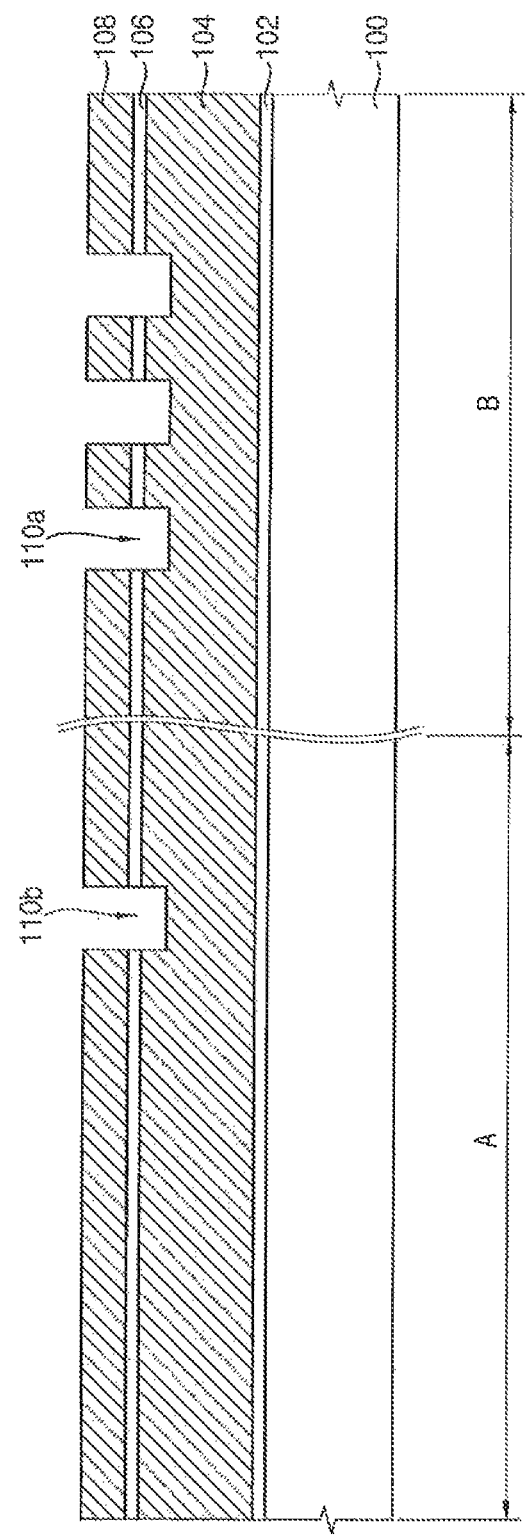

Referring to FIG. 4, an etching mask pattern (not illustrated) is formed on the first polysilicon layer 108. The etching mask pattern is formed for partially etching the first polysilicon layer 108 on the blocking dielectric layer 106 in the selecting transistor forming region and the peripheral circuit region. The etching mask pattern partially exposes a central portion where a gate electrode of the selecting transistor is to be formed. In addition, the etching mask pattern includes a plurality of line shaped openings at a position where a gate electrode for a peripheral transistor is to be formed.

The first polysilicon layer 108 is etched using the etching mask pattern as an etching mask. The blocking dielectric layer 106 under the exposed portions of the first polysilicon layer 108 is also etched. An upper surface portion of the floating gate layer 104 under the etched portions of the blocking dielectric layer 106 is also partially etched. Alternatively, the floating gate layer 104 is not etched.

The etching process results in a second opening 110b corresponding to the area where the gate electrode of the selecting transistor is to be formed. Further, first openings 110a having a line shape are formed at positions corresponding to the area where the gate electrode for the peripheral transistor is to be formed. The first openings 110a penetrate the first polysilicon layer 108 and the blocking dielectric layer 106 and may partially penetrate the floating gate layer 104. The depth of the first openings 110a is determined by controlling an etching depth of the floating gate layer 104.

Depending on the width of the first openings 110a and an interval between the first openings 110a, the width of the concavo-convex portion of the upper surface of the gate electrode of the finally formed peripheral transistor is determined. Accordingly, the gate electrode having the desired concavo-convex portion for the peripheral transistor is formed by controlling the width of the first openings 110a and the interval between the first openings 110a. In addition, the depth of the concavo-convex portion of the upper surface of the gate electrode for the peripheral transistor varies depending on the depth of the first openings 110a. Accordingly, the gate electrode for the peripheral transistor including the concavo-convex portion having the desired depth is formed by controlling the depth of the first openings 110a.

Then, the etching mask pattern formed on the first polysilicon layer 108 is removed.

Figure 5:
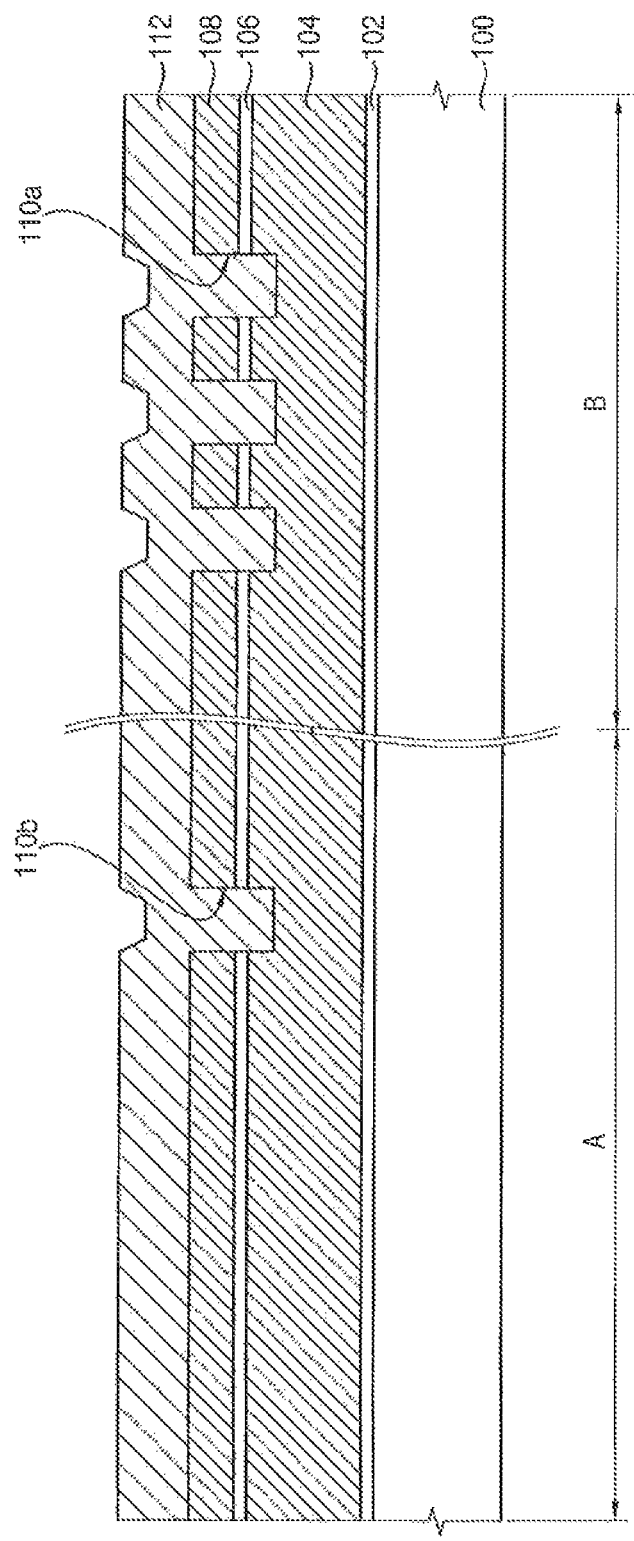

Referring to FIG. 5, a second polysilicon layer 112 is formed along a surface of the first polysilicon layer 108, and in the first and second openings 110a and 110b.

The upper surface of the second polysilicon layer 112 in the peripheral circuit region includes the concavo-convex portion along the profile of the surface portion over the first openings 110a and over the upper surface of the first polysilicon layer 108. The depth and the width of the concavo-convex portion may vary depending on the depth and the width of the first openings 110a. In addition, the depth and the width of the concavo-convex portion may vary depending on a depositing thickness of the second polysilicon layer 112.

The upper surface of the second polysilicon layer 112 in the selecting transistor forming region in the cell region includes a concavo-convex portion along the profile of the upper surface of the second opening 110b and the first polysilicon layer 108.

In the portion where the cell transistor is to be formed in the cell region, a floating gate layer 104, a blocking dielectric layer 106, a first polysilicon layer 108 and a second polysilicon layer 112 are integrated. The first and second polysilicon layers 108 and 112 in the cell transistor portion are formed to be a control gate electrode in a following process. Since the blocking dielectric layer 106 is not removed where the cell transistor is formed, the upper surfaces of the first and second polysilicon layers 108 and 112 are planar in portion where the cell transistor is to be formed.

In the portion where the selecting transistor is to be formed in the cell region, the floating gate layer 104, a portion of the blocking dielectric layer 106, the first polysilicon layer 108 and the second polysilicon layer 112 are integrated. In the selecting transistor region, a portion of the blocking dielectric layer 106 is removed and the floating gate layer 104, the first polysilicon layer 108 and the second polysilicon layer 112 are electrically connected to each other. The floating gate layer 104, the first and the second polysilicon layers 108 and 112 are provided as parts of a gate electrode of the selecting transistor in a following process. The gate electrode of the selecting transistor includes the first conductive layer pattern 104b, the third and fourth polysilicon patterns 108b and 112b, and the second metal silicide pattern 124b.

In the region where the peripheral transistor is formed in the peripheral circuit region, the floating gate layer 104, a portion of the blocking dielectric layer 106, and the first and second polysilicon layers 108 and 112 are integrated. In the peripheral transistor portion, the blocking dielectric layer 106 is partially removed to include the line shaped openings so as to make an electric connection between the floating gate layer 104 and the first and second polysilicon layers 108 and 112. The floating gate layer 104 and the first and second polysilicon layers 108 and 112 are provided as parts of the gate electrode of the peripheral transistor in a following process. The gate electrode of the peripheral transistor includes the second conductive layer pattern 104c, the fifth and sixth polysilicon patterns 108c and 112c, and the third metal silicide pattern 124c.

Figure 6:
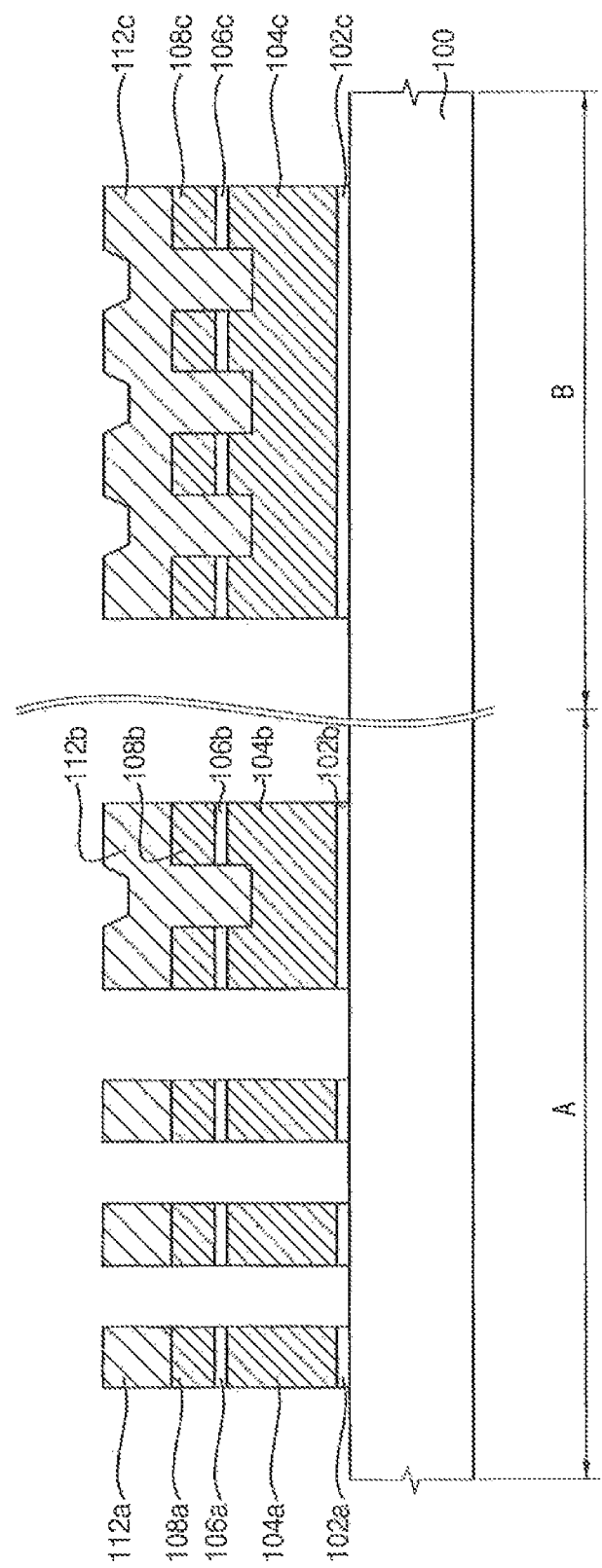

Referring to FIG. 6, an etching mask pattern (not illustrated) is formed on the second polysilicon layer 112. The etching mask pattern is an etching mask for patterning the cell transistor, the selecting transistor and the peripheral transistors. Using the etching mask pattern, the second polysilicon layer 112, the first polysilicon layer 108, the blocking dielectric layer 106, the floating gate layer 104 and the tunnel oxide layer 102 are etched.

Through the etching process, a first structure formed by integrating a tunnel oxide layer pattern 102a, a floating gate pattern 104a, a first dielectric layer pattern 106a, a first polysilicon pattern 108a and a second polysilicon pattern 112a is obtained.

In the selecting transistor forming region, a second structure formed by integrating a first gate oxide layer pattern 102b, a first conductive layer pattern 104b, a second dielectric layer pattern 106b contacting a portion of the upper surface of the first conductive layer pattern 104b, a third polysilicon pattern 108b and a fourth polysilicon pattern 112b is obtained.

In the peripheral transistor forming region, a third structure formed by integrating a second gate oxide layer pattern 102c, a second conductive layer pattern 104c, a third dielectric layer pattern 106c including a plurality of opening portions, a fifth polysilicon pattern 108c and a sixth polysilicon pattern 112c is obtained. The first structure has a narrower line width than the second structure. The second structure has a narrower line width than the third structure. As described above, the upper surface of the third structure includes a concavo-convex portion.

Figure 7:
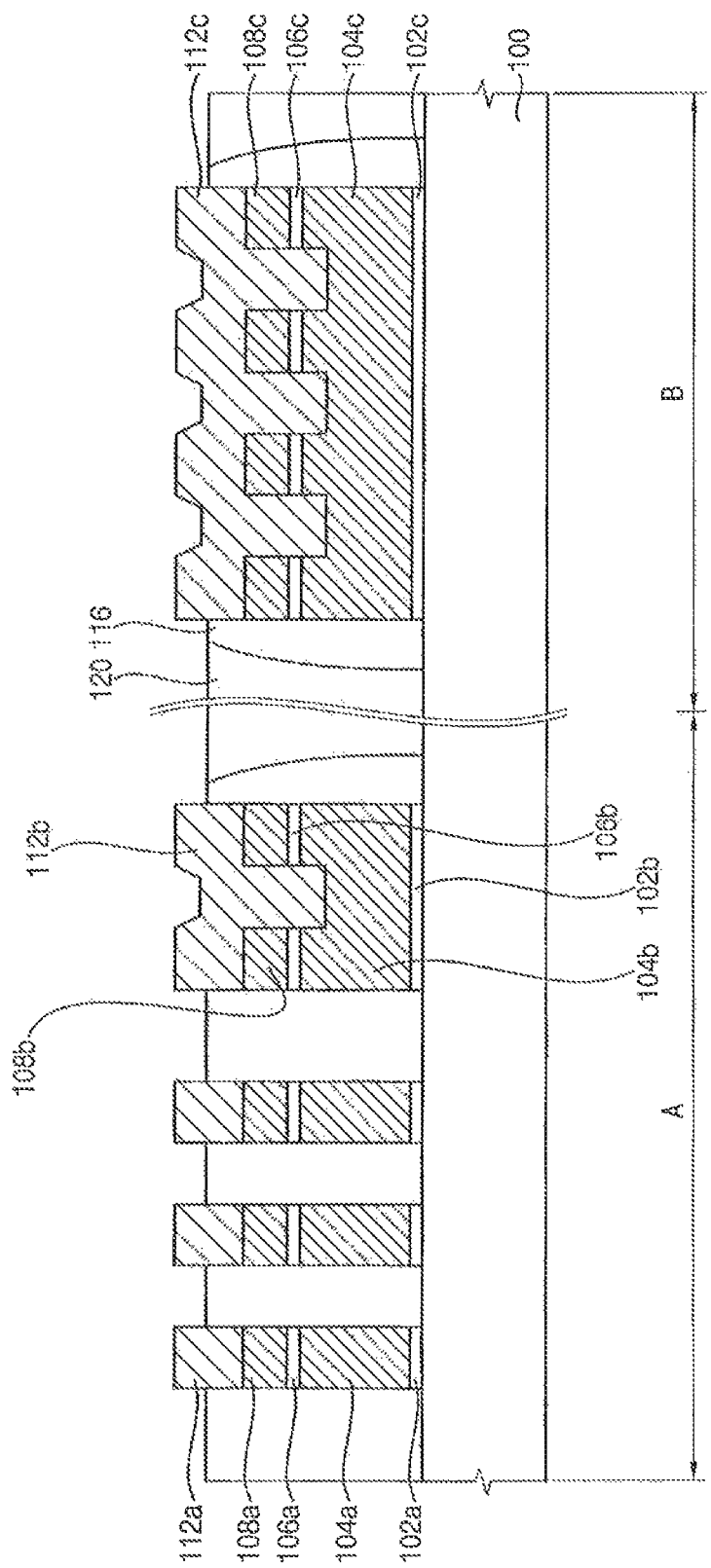

Referring to FIG. 7, a spacer layer is formed on sidewalls portion of the second and third structures. In accordance with an embodiment of the inventive concept, the spacer layer is anisotropically etched to form sidewall spacers 116. The sidewall spacers 116 are formed using silicon oxide.

An insulating interlayer 120 is formed on the substrate 100 to fill gaps between the first, second and third structures. In accordance with an embodiment of the inventive concept, the insulating interlayer 120 is formed by depositing silicon oxide.

The insulating interlayer 120 and the sidewall spacers 116 are partially etched to expose the upper surfaces and part of the upper sidewall portions of the first to third structures. In accordance with an embodiment of the inventive concept, the upper surface of the etched insulating interlayer 120 is positioned higher than the upper surface of the first dielectric layer pattern 106a. After performing the etching process, a the upper surfaces and part of the sidewalls of the second, fourth and sixth polysilicon patterns 112a, 112b and 112c in the first to third structures are exposed.

Figure 8:
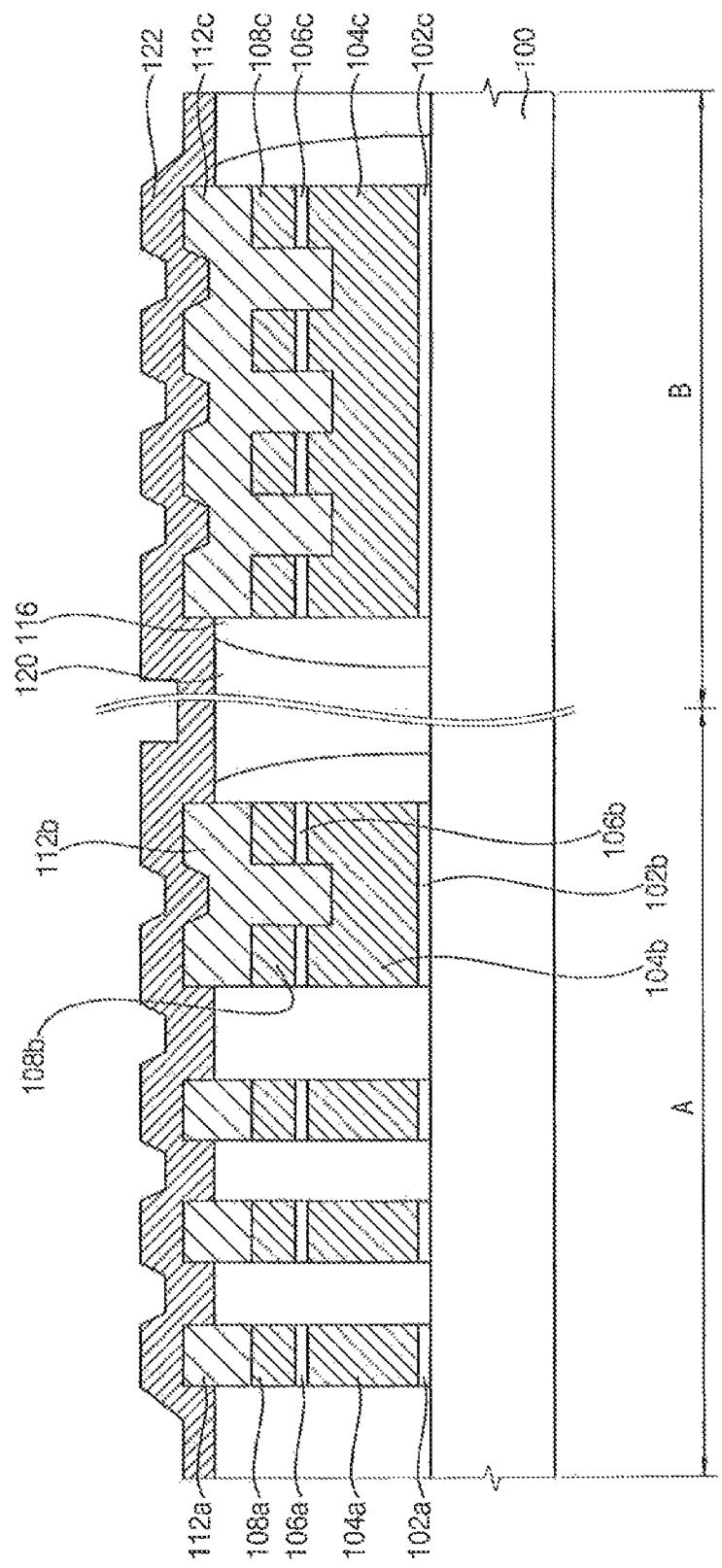

Referring to FIG. 8, a metal layer 122 is formed on the surface of the insulating interlayer 120 and on the first to third structures. In accordance with an embodiment of the inventive concept, the metal layer 122 is formed using a metal such as cobalt, nickel, tungsten, etc.

Since the upper surface of the third structure includes the concavo-convex portion, the metal layer 122 on the upper surface portion of the third structure is formed along the concavo-convex portion.

Figure 9:
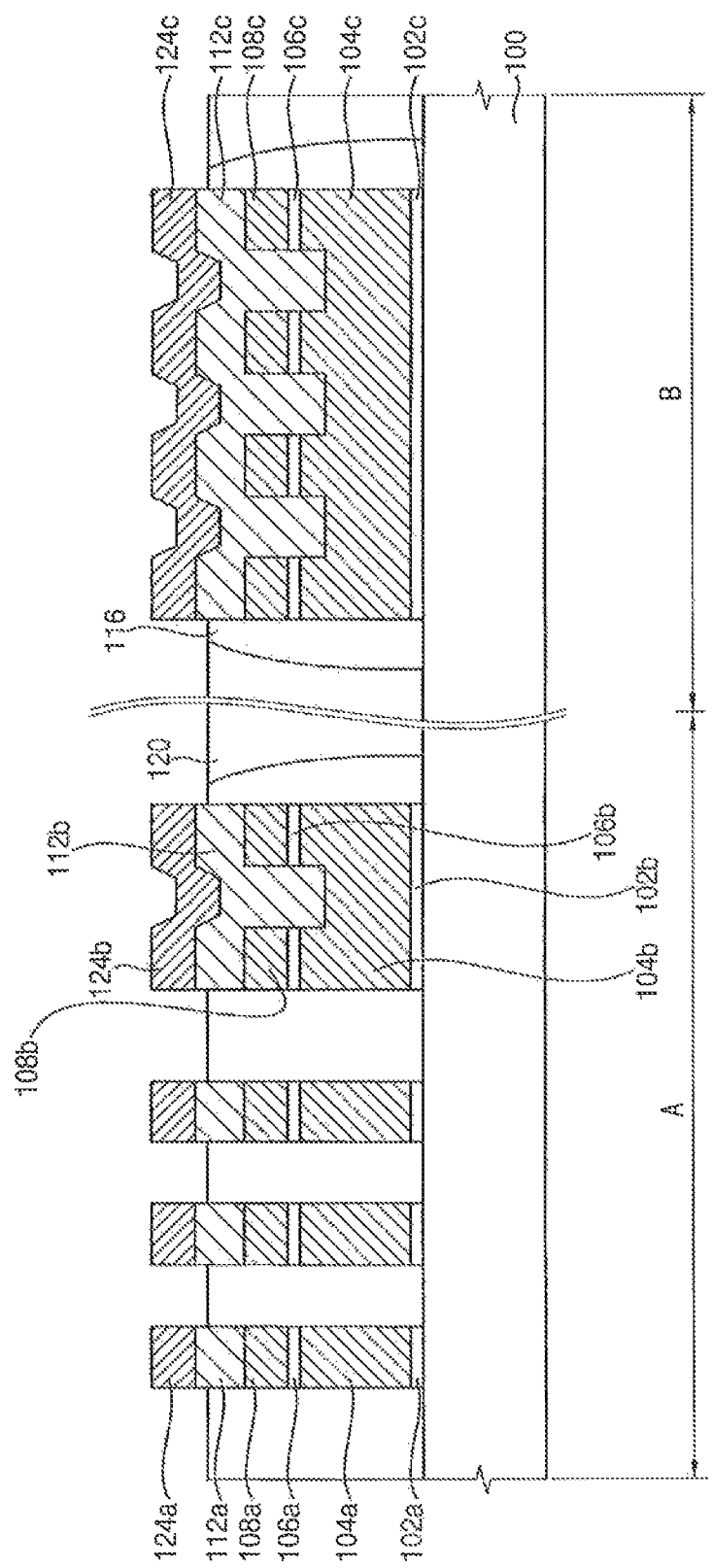

Referring to FIG. 9, a thermal treating process is applied to result in a reaction of the metal layer 122 with the second, fourth and sixth polysilicon patterns 112a, 112b and 112c to form a first metal silicide pattern 124a, a second metal silicide pattern 124b and a third metal silicide pattern 124c, respectively.

Since the metal layer 122 is formed on the upper surface and the upper sidewall portion of the first and second structures, a silicidation reaction occurs at the upper surface portions of the first and second structures, and at the upper sidewall portions. Particularly, since the first and second structures have a narrower line width than the third structure, the metal layer 122 formed on the first and second structures undergoes the silicidation reaction rapidly to form a 20) first metal silicide pattern 124*a* and a second metal silicide pattern 124*b* having a uniform thickness.

Figure 10:
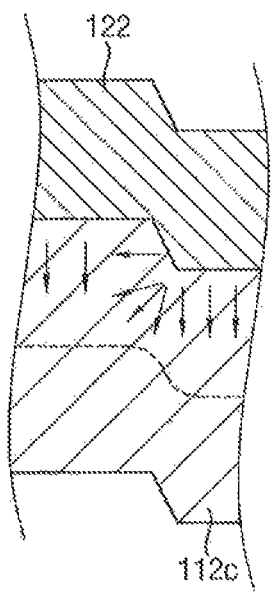

FIG. 10 is an enlarged diagram of a portion of a polysilicon pattern and a metal layer of the third structure.

Referring to FIG. 10, the metal layer 122 is formed on the upper surface of the third structure and the upper sidewall of the third structure including the line shaped concavo-convex portion. Accordingly, the silicidation reaction occurs horizontally and vertically along the surface of each concavo-convex portion of the third structure. Since the silicidation reaction takes place in three dimensions at the upper surface of the third structure, the metal layer rapidly undergoes the silicidation reaction to form a third metal silicide pattern 124*c* illustrated in FIG. 9. The third metal silicide pattern 124*c* has a uniform thickness even though the third structure has a relatively large line width.

With respect to a third structure that does not have the concavo-convex portion and includes only a planar upper surface portion, the silicidation reaction may be performed horizontally and vertically at the upper sidewall portion. However, the silicidation reaction at the planar upper surface portion occurs only in the vertical direction. Accordingly, the silicidation reaction at a center portion of the third structure is slower than at the edge portion. Particularly, since the line width of the third structure may be relatively large, the difference between the silicidation reaction rate at the center portion and at the edge portion may be large. At the center portion of the upper surface portion of the third structure, the metal silicide layer pattern may have a very thin thickness. In addition, a thickness deviation of the silicide layer pattern may be generated for each position of the semiconductor device in each substrate.

However, in example embodiments, since the concavo-convex portion is formed on the upper surface of the third structure, the silicidation reaction rate is very fast and the third metal silicide pattern 124*c* having a uniform thickness is formed on the upper surface of the third structure.

Through the silicidation process, a first gate structure formed by integrating a tunnel oxide layer pattern 102*a*, a floating gate pattern 104*a*, a first dielectric layer pattern 106*a*, a first and second polysilicon patterns 108*a* and 112*a* and a first metal silicide pattern 124*a* in the cell transistor region.

In the selecting transistor region, a second gate structure is formed by integrating a first gate oxide layer pattern 102*b*, a first conductive layer pattern 104*b*, a second dielectric layer pattern 106*b* covering a portion of the upper surface of the first conductive layer pattern 104*b*, third and fourth polysilicon patterns 108*b* and 112*b* and a second metal silicide pattern 124*b*.

In the peripheral transistor region, a third gate structure is formed by integrating a second gate oxide layer pattern 102*c*, a second conductive layer pattern 104*c*, a third dielectric layer pattern 106*c*, including a plurality of opening portions, on the second conductive layer pattern 104*c*, fifth and sixth polysilicon patterns 108*c* and 112*c* and a third metal silicide pattern 124*c*.

In example embodiments, a metal silicide pattern having a uniform thickness may be formed without requiring additional processes. In addition, a semiconductor device having consistent operating characteristics and good electrical characteristics may be manufactured.

Figure 11:
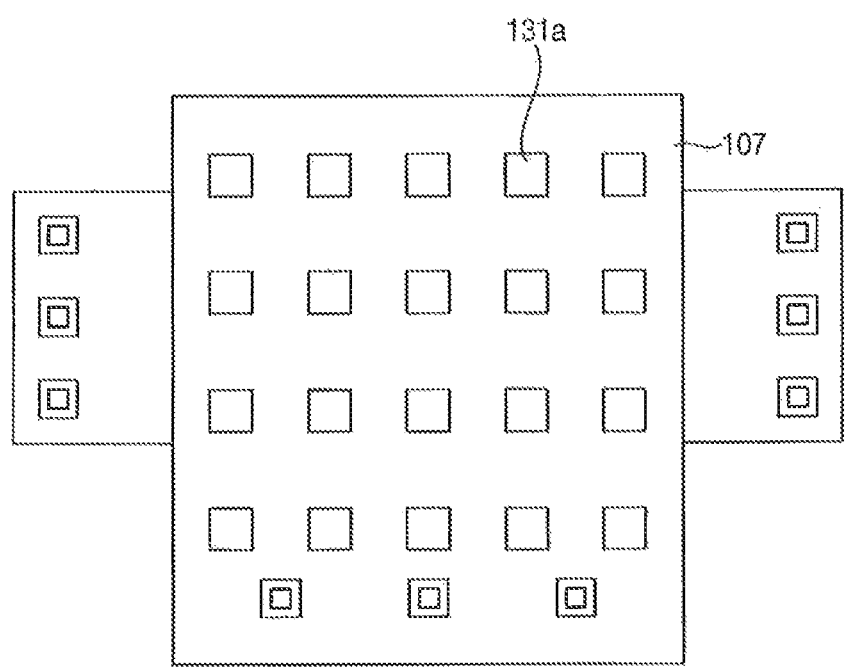

FIG. 11 is a plan view illustrating a dielectric layer portion of a peripheral transistor in a semiconductor device in accordance with another example embodiment.

In accordance with an embodiment of the inventive concept, the semiconductor device illustrated in FIG. 11 is the same as or substantially similar to the semiconductor device illustrated in FIG. 1 except for the shape of a gate electrode of a peripheral transistor.

Referring to FIG. 11, a cell transistor and selecting transistors having the same shape as illustrated in FIG. 1 are provided on the substrate in the cell region.

On the substrate in the peripheral circuit region, a third gate structure obtained by integrating a second gate oxide layer, a second conductive layer pattern, a third dielectric layer pattern including a plurality of opening portions, fifth and sixth polysilicon patterns and a third metal silicide pattern are provided. In example embodiments, the third dielectric layer pattern 107 includes a plurality of opening portions 131*a*, such as, for example, holes. In accordance with an embodiment of the inventive concept, the plurality of the holes is arranged in a regular pattern.

At the opening portions 131*a*, where the third dielectric layer pattern 107 has been removed, the second conductive layer pattern and the fifth polysilicon pattern contact each other via the sixth polysilicon pattern to make an electrical connection. Since the third dielectric layer pattern 107 is not provided at the opening portions 131*a*, the height of the upper surface portion of the sixth polysilicon pattern at the opening portions 131*a* is lower than the height of the sixth polysilicon pattern positioned on the third dielectric layer pattern 107. The third metal silicide pattern provided on the sixth polysilicon pattern has a repeating shape of a low step portion and a high step portion having line shapes. In example embodiments, the third metal silicide pattern has a uniform thickness.

In accordance with an embodiment of the inventive concept, the semiconductor device illustrated in FIG. 11 is the same as or substantially similar to the semiconductor device illustrated in FIG. 1 except for the shape of the opening portions of the third dielectric layer pattern included in the gate electrode of the peripheral transistor. Accordingly, the semiconductor device illustrated in FIG. 11 may be manufactured by the processes described in connection with the embodiment of FIG. 1, except for forming an etching mask pattern having regular hole shapes for forming the openings 131*a* in the third dielectric layer pattern 107.

Processes explained referring to FIG. 3 may be executed to form the structure illustrated in FIG. 3. On the first polysilicon layer 108, an etching mask pattern (not illustrated) is formed. The etching mask pattern is formed so as to include a plurality of holes at positions for forming a gate electrode for a peripheral transistor. Using the etching mask pattern, the first polysilicon layer, and a blocking dielectric layer 106 are etched. Further, a portion of the upper surface of the floating gate layer 104 is etched.

The same processes explained referring to FIGS. 5 to 10 may be executed to form a semiconductor device illustrated in FIG. 11.

Figure 12:
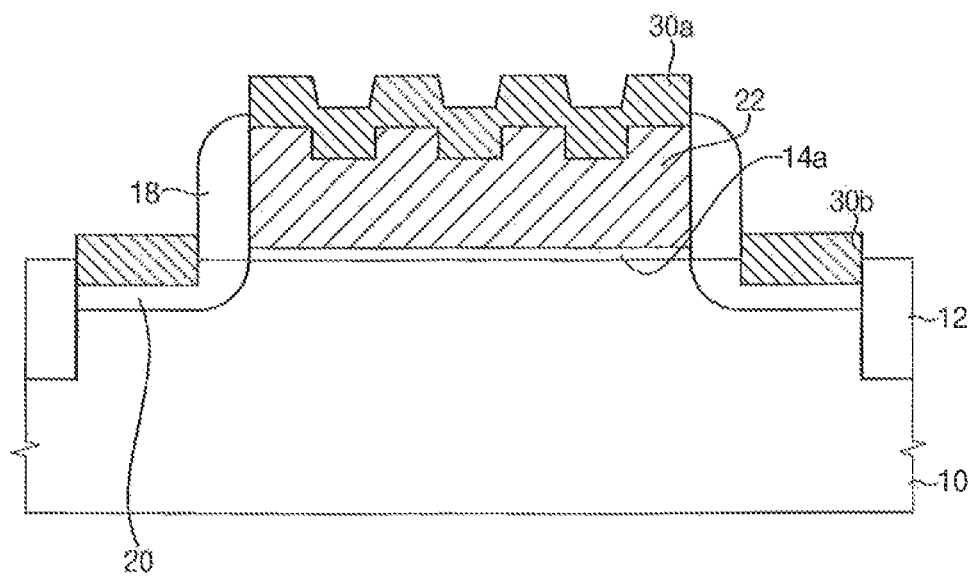

FIG. 12 is a cross-sectional view illustrating a semiconductor device in accordance with another example embodiment.

Referring to FIG. 12, a substrate 10 divided into an active region and a device isolation region by a device isolation layer pattern 12 is provided. On the substrate 10, a gate structure including a gate oxide layer pattern 14a and gate electrodes 22 and 30a are formed.

The gate electrode has an integrated shape of a polysilicon pattern 22 and a first metal silicide pattern 30a. The first metal silicide pattern 30a is formed using, for example, cobalt silicide, nickel silicide, tungsten silicide, etc.

The upper surface of the polysilicon pattern 22 is not planar but includes a concavo-convex portion having line shapes. Since the first metal silicide pattern 30a is provided on the upper surface of the polysilicon pattern 22, the upper surface of the first metal silicide pattern 30a also includes the concavo-convex portion having the line shapes. In accordance with an embodiment of the inventive concept, the first metal silicide pattern 30a has a uniform thickness.

On both sidewalls of the gate structure, a spacer 18 is provided. The upper surface of the spacer 18 is positioned lower than the upper surface of the gate structure.

Impurity doped regions 20 are provided at upper portions of the substrate 10 at both side portions of the gate structure. At the upper surface of the impurity region 20, a second metal silicide pattern 30b is provided. Alternatively, the second metal silicide pattern 30b is not provided.

The semiconductor device in accordance with example embodiments includes a gate electrode including a metal silicide pattern having a uniform or substantially uniform thickness. Accordingly, the semiconductor device may have high reliability.

FIGS. 13 to 16 are cross-sectional views illustrating a method of manufacturing the semiconductor device illustrated in FIG. 12.

Figure 13:
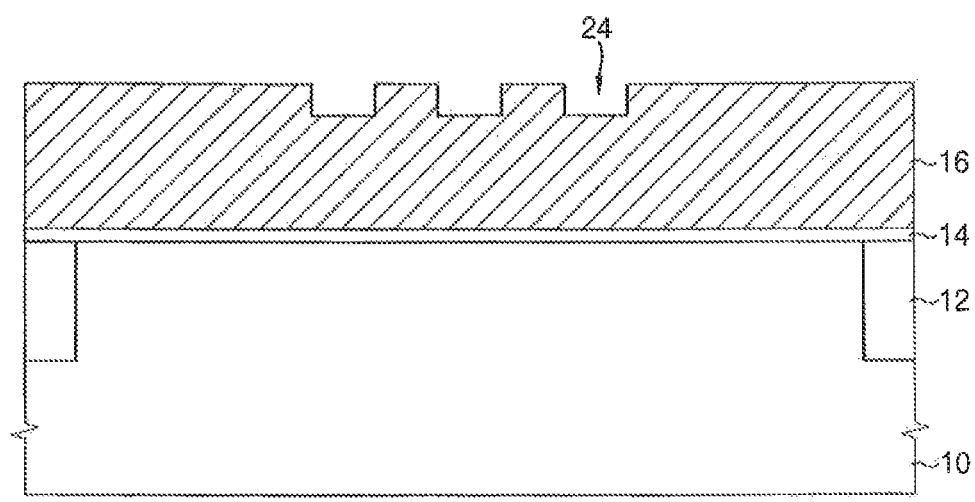

Referring to FIG. 13, a device isolating process is executed with respect to a substrate 10 to form a device isolation layer pattern 12 for separating an active region and a field region. The substrate 10 includes a semiconductor substrate including a silicon substrate, a germanium substrate, a silicon-germanium substrate, a silicon-on-insulator (SOI) substrate, a germanium-on-insulator (GOI) substrate, etc.

On the substrate 10, a gate oxide layer 14 and a preliminary polysilicon layer 16 are formed.

On the preliminary polysilicon layer 16, a first etching mask pattern (not illustrated) is formed. The first etching mask pattern is a mask for forming a concavo-convex portion on the upper surface portion of the preliminary polysilicon layer 16. In example embodiments, the first etching mask pattern has a plurality of line shapes. Alternatively, the first etching mask pattern includes a plurality of holes formed in a regular pattern.

The upper surface portion of the preliminary polysilicon layer is partially etched to a predetermined thickness using the first etching mask pattern. Through the etching process, a polysilicon layer 22 including an upper surface portion having a concavo-convex portion 24 is formed. In example embodiments, each of the concavo portion and the convex portion has a line shape. Alternatively, the concavo portion may have a shape including a regular pattern of holes. The first etching mask pattern is then removed.

Figure 14:
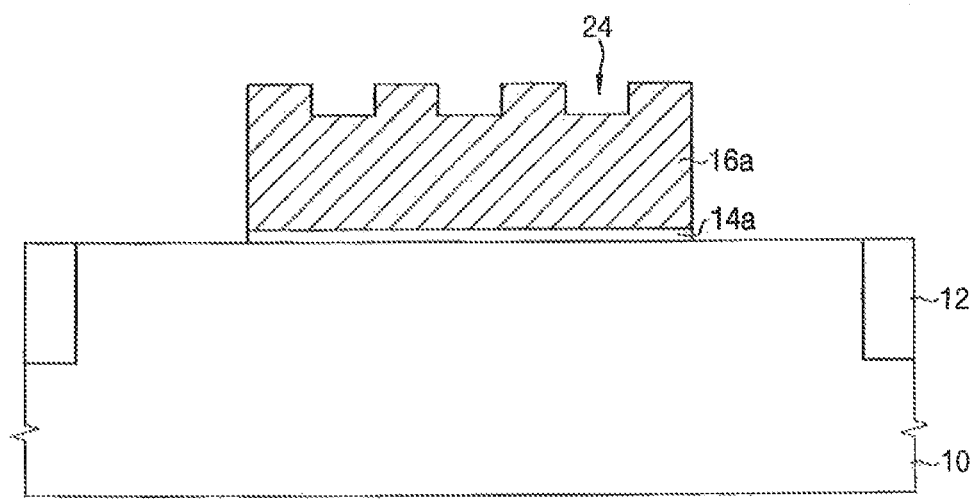

Referring to FIG. 14, a second etching mask pattern (not illustrated) is formed on the preliminary polysilicon layer 16. The preliminary polysilicon layer 16 is etched using the second etching mask pattern to form a preliminary polysilicon pattern 16a. The second etching mask pattern is then removed.

Figure 15:
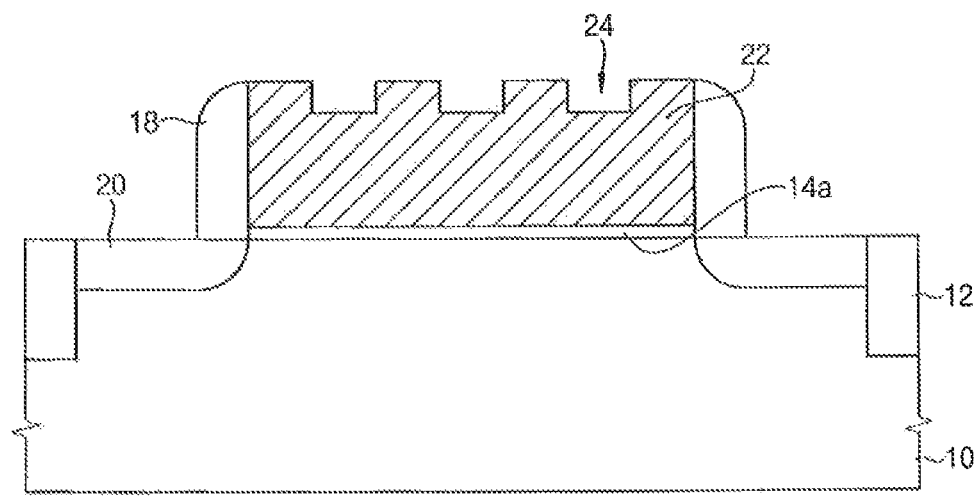

Referring to FIG. 15, a spacer layer is formed along the surface of the preliminary polysilicon pattern 16a and of the substrate 10. In accordance with an embodiment of the inventive concept, the spacer layer is anisotropically etched to form a spacer 18 at the sidewall of the preliminary polysilicon pattern 16a. Impurities are doped into the surface of the substrate 10 at both sides of the spacer 18 to form an impurity doped region.

Figure 16:
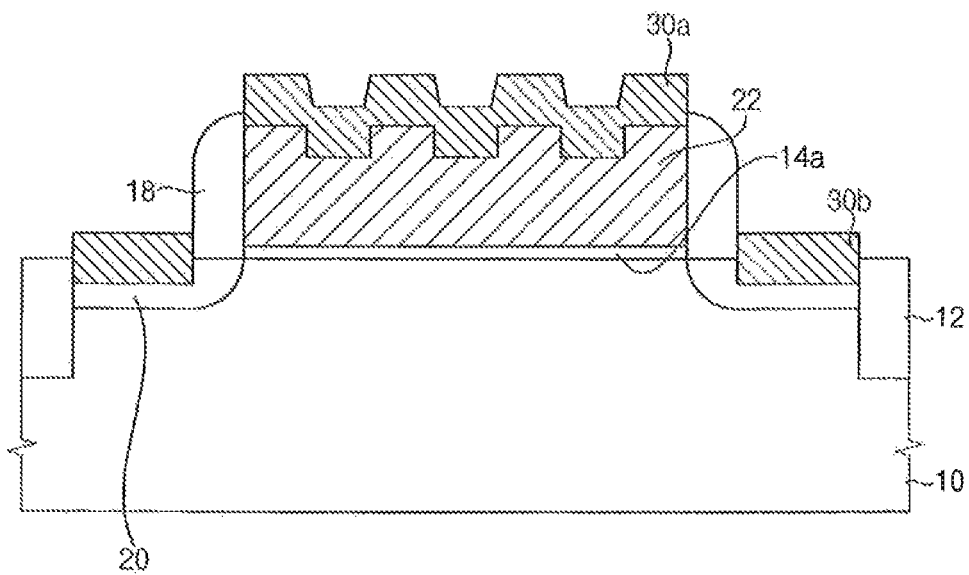

Referring to FIG. 16, a metal layer (not illustrated) is formed on the surface of the polysilicon pattern 22, the spacer 18 and the substrate 10. The metal layer is formed using a metal such as cobalt, nickel, tungsten, etc. Since the polysilicon pattern 22 includes a concavo-convex portion 24 at the upper surface, the metal layer formed on the upper surface portion of the polysilicon pattern 22 is formed along the concavo-convex portion 24.

In accordance with an embodiment of the inventive concept, a thermal treating process is executed to cause a reaction of the metal layer with the polysilicon pattern 22 and the substrate 10 to form a first metal silicide pattern 30a and a second metal silicide pattern 30b.

The metal layer is formed on the upper surface portion of the polysilicon pattern 22 including the concavo-convex portion 24 having the line shapes. Accordingly, the silicidation reaction occurs in a horizontal direction and a vertical direction with respect to the surface of each concavo-convex portion 24 of the polysilicon pattern. Since the silicidation reaction takes place in three dimensions at the upper surface of the polysilicon pattern 22, the silicidation of the metal layer rapidly proceeds to form the first metal silicide pattern 30a having a uniform thickness, even though the line width of the polysilicon pattern 22 may be relatively large.

Figure 17:
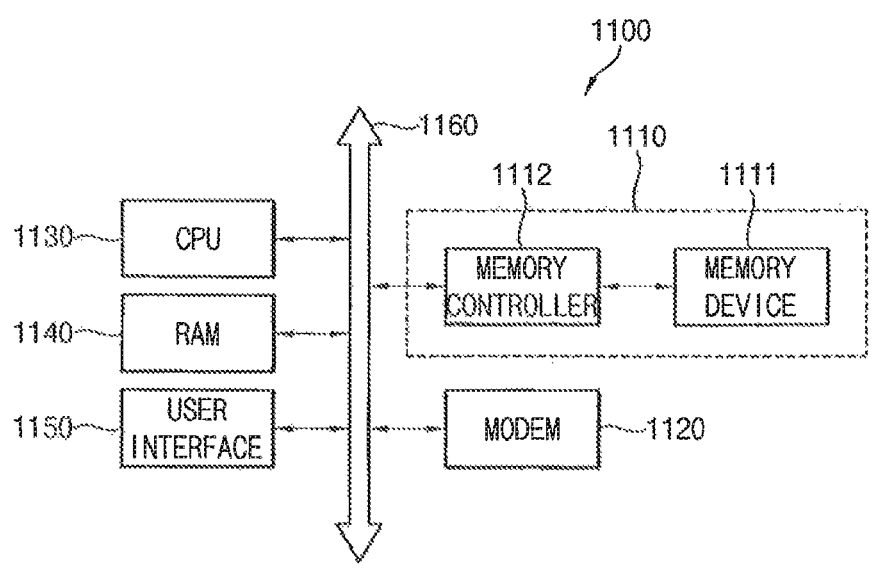

FIG. 17 is a block diagram illustrating an information processing system including a semiconductor device manufactured in accordance with example embodiments.

Referring to FIG. 17, an information processing system 1100 includes a memory device 1111 including a gate electrode structure in accordance with example embodiments. Particularly, the memory device 1111 may be, for example, a flash memory device.

The information processing system 1100 includes a memory system 1110, a modem 1120, a central processing unit (CPU) 1130, a RAM 1140 and a user interface 1150, each of these elements being electrically connected to a system bus 1160. The memory system 1110 includes the memory device 1111 and a memory controller 1112. The memory system 1110 stores data processed by the CPU 1130 and inputted data from an external source. The memory system 1110 is constituted, for example, as a semiconductor disc device (SSD). The information processing system 1100 may stably store a large capacity of data in the memory system 1110. In addition, as reliability of the memory system 1110 increases, resources required for correcting errors may be saved. Accordingly, a data exchanging function at a high speed may be accomplished by the information processing system 1100.

The information processing system 1100 in accordance with example embodiments may further include, for example, an application chipset, a camera image processor (CIS), a mobile DRAM, an input/output device, etc.

As described above, a semiconductor device including a gate electrode having a low resistance and consistent operating characteristics may be manufactured. The embodiments of the present inventive concept are applicable to various semiconductor devices including a gate electrode and electronic appliances and telecommunication products including a semiconductor device.

Although a few example embodiments have been described, those skilled in the art will readily appreciate that many modifications are possible in the example embodiments without materially departing from the novel teachings of the present inventive concept. Accordingly, all such modifications are intended to be included within the scope of the present inventive concept as defined in the claims.

What is claimed is:

1. A semiconductor device comprising:
a first structure provided in a cell transistor region of a substrate, the first structure including a floating gate electrode, a first dielectric layer pattern covering a whole upper surface of the floating gate electrode, a control gate electrode on the first dielectric layer pattern, the control gate electrode including a. metal;
a second structure provided in a selecting transistor region of the substrate, the second structure including a first conductive layer pattern, a second dielectric layer pattern covering a portion of an upper surface of the first conductive layer pattern, and a first electrode, wherein the first electrode includes the metal, and electrically connected to the first conductive layer pattern; and
a third structure provided in a peripheral circuit region of the substrate, the third structure including a second conductive layer pattern, a third dielectric layer pattern including a plurality of opening portions on the second conductive layer pattern, and a second electrode including the metal, wherein the second conductive layer pattern includes a plurality of low step portions and a plurality of high step portions in a contact with the low step portions, wherein the third dielectric layer pattern contacts the second conductive layer pattern exclusively at the high step portions, wherein the second electrode is disposed in respective opening portions and contacts the second conductive layer pattern.

2. The semiconductor device of claim 1, wherein the first and second structures have a narrower line width than a line width of the third structure.

3. The semiconductor device of claim 1, wherein each of the opening portions in the third dielectric layer pattern have one of a line shape or a hole shape.

4. The semiconductor device of claim 1, therein an upper surface of the second conductive layer pattern includes concavo-convex portions.

5. The semiconductor device of claim 1, wherein the control gate electrode, first electrode and second electrode include metal silicide or metal.

6. The semiconductor device of claim 5, wherein the control gate electrode, first electrode and second electrode comprise at least one of cobalt silicide, nickel silicide, tungsten silicide, cobalt, nickel, and tungsten.

7. The semiconductor device of claim 1, wherein the third structure has a line width of two more times a line width of the second structure.

8. The semiconductor device of claim 1, wherein the second electrode has a substantially uniform thickness along a line width of the third structure.

9. The semiconductor device of claim 1, wherein each of the first and second electrodes include a polysilicon layer pattern and metal suicide pattern subsequently stacked.

10. A semiconductor device comprising:
a fist structure provided in a cell transistor region of a substrate, the first structure including a floating gate electrode, a first dielectric layer pattern covering a whole upper surface of the floating gate electrode, a control gate electrode on the first dielectric layer pattern, the control gate electrode including a metal;
a second structure provided in a selecting transistor region of the substrate, the second structure including a first conductive layer pattern, a second dielectric layer pattern covering a portion of an upper surface of the first conductive layer pattern, and first electrode, wherein the first electrode includes the metal, and electrically connected to the first conductive layer pattern; and
a third structure provided in a peripheral circuit region of the substrate, the third structure including a second conductive layer pattern, a third dielectric layer pattern including a plurality of opening portions on the second conductive layer pattern, and a second electrode including the metal, wherein an upper surface portion of the second electrode includes concavo-convex portions wherein the second electrode is disposed in respective opening portions and contacts the second conductive layer pattern.

11. The semiconductor device of claim 10, wherein the concavo-convex portions of the second electrode are formed to be substantially aligned with the plurality of opening portions disposed thereunder.

12. A semiconductor device comprising:
a first structure provided in a cell transistor region of a substrate, the first structure including a floating gate electrode, a first dielectric layer pattern covering a whole upper surface of the floating gate electrode, a control gate electrode on the first dielectric layer pattern, the control gate electrode including a first metal containing pattern;
a second structure provided in a selecting transistor region of the substrate, the second structure including a first conductive layer pattern, a second dielectric layer pattern covering a portion of an upper surface of the first conductive layer pattern thereby forming a first opening portion on the first conductive layer pattern., a first gate electrode, wherein the first electrode includes a second metal containing pattern, and electrically connected to the first conductive layer pattern; and
a third structure provided in a peripheral circuit region of the substrate, the third structure including a second conductive layer pattern, a third dielectric layer pattern including a plurality of second opening portions on the second conductive layer pattern, a second electrode disposed in respective openings portions and contacting the second conductive layer pattern, wherein the first electrode includes a third metal containing pattern, wherein an upper surface portion of the third metal containing a pattern includes concavo-convex portions, wherein the number of the second opening portions is more than that of the first opening portion.

13. The semiconductor device of claim 12, wherein the concavo-convex portions of the third metal containing pattern are formed to be substantially aligned with the plurality of second opening portions disposed thereunder.

14. The semiconductor device of claim 12, wherein the first, the second, and the third metal containing pattern include metal silicide or metal.

15. The semiconductor device of claim 14, wherein the metal of the first, the second, and the third metal containing pattern include cobalt silicide, nickel silicide, tungsten silicide, cobalt, nickel, and tungsten.

16. The semiconductor device of claim 12, wherein the third structure has a line width of two or more times a line width of the second structure.

17. The semiconductor device of claim 12, wherein the third metal containing pattern has a substantially uniform thickness along a line width of the third structure.

18. The semiconductor device of claim 12, wherein each of the first and second electrodes include a polysilicon layer pattern and metal silicide pattern subsequently stacked.

* * * * *